United States Patent
Im

(10) Patent No.: US 10,043,478 B2
(45) Date of Patent: *Aug. 7, 2018

(54) DISPLAY DEVICE

(71) Applicant: SAMSUNG DISPLAY CO., LTD., Yongin, Gyeonggi-Do (KR)

(72) Inventor: Jung Jun Im, Cheonan-si (KR)

(73) Assignee: Samsung Display Co., Ltd. (KR)

( * ) Notice: Subject to any disclaimer, the term of this patent is extended or adjusted under 35 U.S.C. 154(b) by 465 days.

This patent is subject to a terminal disclaimer.

(21) Appl. No.: 14/734,881

(22) Filed: Jun. 9, 2015

(65) Prior Publication Data
US 2015/0279306 A1 Oct. 1, 2015

Related U.S. Application Data

(62) Division of application No. 14/291,912, filed on May 30, 2014, now Pat. No. 9,070,594.

(30) Foreign Application Priority Data

Jul. 4, 2013 (KR) .................. 10-2013-0078429

(51) Int. Cl.
  *H01L 27/14* (2006.01)
  *G09G 5/00* (2006.01)
  (Continued)

(52) U.S. Cl.
  CPC .............. *G09G 5/00* (2013.01); *G09G 5/18* (2013.01); *H01L 27/124* (2013.01);
  (Continued)

(58) Field of Classification Search
  CPC .................. G09G 5/00; H01L 27/124
  (Continued)

(56) References Cited

U.S. PATENT DOCUMENTS 9,070,594 B2 * 6/2015 Im .................. H01L 27/1222
2003/0052597 A1  3/2003 Sakurai
(Continued)

FOREIGN PATENT DOCUMENTS

| KR | 10-2005-0003282 | 1/2005 |
| KR | 10-2006-0084201 | 7/2006 |
| KR | 10-2007-0003178 | 1/2007 |

*Primary Examiner* — Igwe U Anya
(74) *Attorney, Agent, or Firm* — Innovation Counsel LLP

(57) ABSTRACT

There is provided a display device comprising a display panel, wherein the display panel comprises pixels, data lines, thin film transistors including first electrodes electrically connected with the data lines, second electrodes disposed to be spaced apart from the first electrodes in a first direction, semiconductor layers overlapping the first electrodes and the second electrodes, and gate electrodes overlapping the semiconductor layers and pads electrically connected with the second electrodes, wherein the thin film transistors includes first thin film transistors and second thin film transistors, which are alternately disposed, the semiconductor layers are divided into first semiconductor layers included in the first thin film transistors and second semiconductor layers included in the second thin film transistors, which are alternately disposed, and a length of the first semiconductor layer in the first direction is larger than a length of the second semiconductor layer in the first direction.

10 Claims, 7 Drawing Sheets

(51) Int. Cl.
  *H01L 27/12* (2006.01)
  *G09G 5/18* (2006.01)
  *H01L 27/32* (2006.01)
  *H01L 29/786* (2006.01)

(52) U.S. Cl.
  CPC . *H01L 27/1222* (2013.01); *G09G 2300/0426* (2013.01); *H01L 27/3262* (2013.01); *H01L 29/786* (2013.01)

(58) Field of Classification Search
  USPC .......................................................... 257/72
  See application file for complete search history.

(56) References Cited

U.S. PATENT DOCUMENTS

| | | |
|---|---|---|
| 2006/0290633 A1* | 12/2006 | Choi ........................ H01L 27/12 345/92 |
| 2008/0012608 A1 | 1/2008 | Sudoh et al. |
| 2009/0152564 A1 | 6/2009 | Wang et al. |
| 2011/0157122 A1 | 6/2011 | Tsai |
| 2012/0056531 A1 | 3/2012 | Park et al. |
| 2012/0104394 A1 | 5/2012 | Park |
| 2012/0313844 A1 | 12/2012 | Im et al. |

\* cited by examiner

DISPLAY DEVICE

CROSS-REFERENCE TO RELATED APPLICATION

This application is a divisional application of U.S. patent application Ser. No. 14/291,912 filed on May 30, 2014, which claims priority to Korean Patent Application No. 10-2013-0078429 filed on Jul. 4, 2013 in the Korean Intellectual Property Office, and all the benefits accruing therefrom under 35 U.S.C. 119, the contents of which in its entirety are herein incorporated by reference.

BACKGROUND

Embodiments of the present invention relate to a display device, and more particularly, to a display device including lines for testing a display panel by using an external input.

As portable display devices such as a notebook computer, a cellular phone, and a PMP as well as fixed display devices such as a TV and a monitor, various flat panel display devices have been widely used. The flat panel display devices include a display panel for displaying an image, and may be classified into a liquid crystal display device, an organic light emitting display device, and an electrophoretic display device according to the type of display panel.

The display device may include a display panel and a driver for driving the display panel. The driver may be formed of an IC, and may be connected with the display panel by a chip on glass (COG) method or a chip on film (COF) method, but is not essentially limited thereto. The driver may provide a plurality of data signals and a plurality of scan signals to a plurality of data lines and a plurality of scan lines included in the display panel, and the display panel may be driven in response to the received signals from the driver.

In a case when defects are found after the drivers are attached to the display panel, both the display panel and the driver may be discarded, or the driver needs to be separated from the display panel in order to re-use the driver, so that a process is inefficient. In order to prevent the problem, it is necessary to detect whether the display panel has defect before the display panel is connected with the driver. In order to detect whether the display panel has defect or not, it is necessary to drive the display panel, and in order to drive the display panel before the display panel is connected with the driver, the display panel may further include panel inspection lines for applying a signal provided from the outside to the plurality of data lines and the plurality of scan lines.

In a case when the panel inspection lines in the display panel have a short circuit, pixels connected to the panel inspection lines may be abnormally operated, thereby considering pixels having no defect as defect pixels.

SUMMARY

An embodiment of the present invention provides a display device capable of decreasing a short circuit of a panel inspection line.

Another embodiment of the present invention provides a display device capable of easily detecting defect of a panel and decreasing a false defect rate by decreasing a generation of a short circuit of a panel inspection line.

According to an aspect of the present invention, there is provided a display device, comprising a display panel, wherein the display panel comprises a plurality of pixels, a plurality of data lines configured to transmit data signals to the plurality of pixels, a plurality of thin film transistors including first electrodes electrically connected with the plurality of data lines, respectively, second electrodes disposed to be spaced apart from the first electrodes in a first direction, semiconductor layers overlapping the first electrodes and the second electrodes, and gate electrodes overlapping the semiconductor layers, respectively and pads electrically connected with the second electrodes, wherein the plurality of thin film transistors includes a plurality of first thin film transistors and a plurality of second thin film transistors, which are alternately disposed, the semiconductor layers are divided into first semiconductor layers included in the first thin film transistors and second semiconductor layers included in the second thin film transistors, the first semiconductor layers and the second semiconductor layers are alternately disposed, and a length of the first semiconductor layer in the first direction is larger than a length of the second semiconductor layer in the first direction.

According to another aspect of the present invention, there is provided a display device, comprising a display panel, wherein the display panel comprises a plurality of pixels, a plurality of data lines configured to transmit data signals to the plurality of pixels, a plurality of thin film transistors including first electrodes electrically connected with the plurality of data lines, respectively, second electrodes disposed to be spaced apart from the first electrodes in a first direction, semiconductor layers overlapping the first electrodes and the second electrodes, and gate electrodes overlapping the semiconductor layers, respectively and pads electrically connected with the second electrodes, and the plurality of thin film transistors includes a plurality of first thin film transistors and a plurality of second thin film transistors, which are alternately disposed, the semiconductor layers of the second thin film transistors are adjacently disposed in a second direction vertical to the first direction of the second electrodes of the first thin film transistors, and the semiconductor layers of the first thin film transistors are adjacently disposed in the second direction of the first electrodes of the second thin film transistors.

Technical problems of the present invention are not limited to the above-mentioned technical problems, and other technical problems, which are not mentioned above, can be clearly understood by those skilled in the art from the following descriptions.

The embodiments of the present invention at least have the following effects.

That is, it is possible to decrease a short circuit of a data input line for testing a display panel.

Further, it is possible to early determine whether a display panel has defect.

The effects according to the present invention are not limited to the contents exemplified above, and more various effects are included in the present specification.

BRIEF DESCRIPTION OF THE DRAWINGS

The above and other features, and advantages of the present invention will become more apparent with reference to the attached drawings in which.

DETAILED DESCRIPTION OF THE EMBODIMENTS

Figure 1:
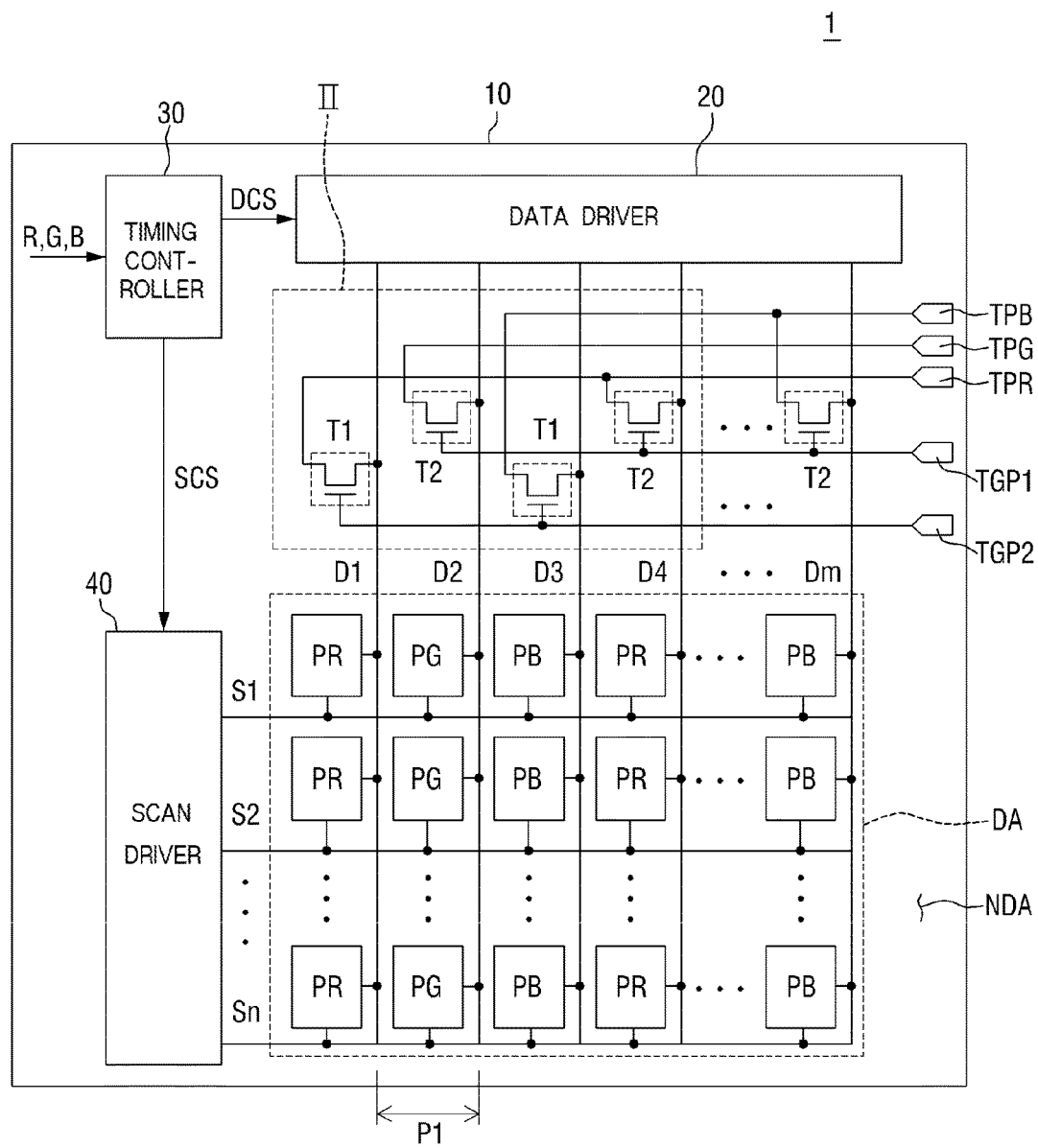
FIG. 1 is a block diagram of a display device according to an embodiment of the present invention.

Advantages and features of the present invention and methods of accomplishing the same may be understood more readily with reference to the following detailed description of preferred embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims. Like reference numerals refer to like elements throughout the specification.

The terminology used herein is for the purpose of describing particular embodiments only and is not intended to limit the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to" or "coupled to" another element or layer, it can either be formed directly on, connected or coupled to the other element or layer, or formed with intervening elements or layers. In contrast, when an element is referred to as being "directly on", "directly connected to" or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers and/or sections, the described elements, components, regions, layers and/or sections are not limited by the terms used. The terms are only used to distinguish one element, component, region, layer or section from another region, layer or section. Thus, a first element, component, region, layer or section discussed below could be termed a second element, component, region, layer or section without departing from the teachings of the present disclosure.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features may then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Embodiments are described herein with reference to cross-section illustrations that are schematic illustrations of idealized embodiments (and intermediate structures). As such, variations from the shapes of the illustrations as a result, for example, of manufacturing techniques and/or tolerances, are to be expected. Thus, these embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of dopant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and this specification and should not be interpreted in an idealized or overly formal sense unless expressly so defined herein.

Hereinafter, embodiments of the present invention will be described with reference to the accompanying drawings.

FIG. 1 is a block diagram of a display device according to an embodiment of the present invention. Referring to FIG. 1, a display device 1 includes a display panel 10.

The display panel 10 may be a liquid crystal display panel, an organic light emitting display panel, and an electrophoretic display panel, but is not essentially limited thereto. The display panel 10 may receive a data signal and a scan signal from a data driver 20 and a scan driver 40 to be described below, respectively, and may display an image corresponding to the received signal. The display panel 10 may be divided into a display area DA in which an image is displayed, and a non-display area NDA in which an image is not displayed, and which surrounds the display area DA. The display panel 10 includes a plurality of pixels PR, PG, and PB, a plurality of data lines D1, D2, . . . , and Dm, and a plurality of thin film transistors T1 and T2, and a plurality of pads TPB, TPG, TPR, TGP1, and TGP2.

The plurality of pixels PR, PG, and PB may be disposed within the display area DA. The plurality of pixels PR, PG, and PB may be disposed in a matrix shape. A column direction of the matrix may be the same as a first direction D1, which is to be described below, and a row direction thereof may be the same as a second direction D2, which is to be described below, vertical to the first direction D1, but the directions are not essentially limited thereto. Each of the plurality of pixels PR, PG, and PB may be connected to at least one of the plurality of data lines D1, D2, . . . , and Dm, and at least one of a plurality of scan lines S1, S2, . . . , Sn to be described below. The plurality of pixels PR, PG, and PB may display gray scales corresponding to signals applied to the plurality of data lines D1, D2, . . . , and Dm. The plurality of pixels PR, PG, and PB may include the first pixel PR, the second pixel PG, and the third pixel PB. The first to third pixels PR, PG, and PB may display different colors, respectively. For example, the first pixel PR may display red color, the second pixel PG may display green color, and the third pixel PB may display blue color, but the pixels are not essentially limited thereto. The first to third pixels PR, PG, and PB may be sequentially and alternately disposed in the row direction of the matrix of the plurality of pixels PR, PG, and PB. For example, the first to third pixels PR, PG, and PB are sequentially disposed in the row direction, and the arrangement may be repeated in the row direction. The same type of pixel may be disposed in one column of the matrix of the plurality of pixels PR, PG, and PB. That is, the column of the matrix may include one pixel among the first to third pixels PR, PG, and PB. The column of each of the first to third pixels PR, PG, and PB may be sequentially and alternately disposed in the row direction of the matrix.

The plurality of data lines D1, D2, . . . , and Dm may be disposed over the display area DA and the non-display area NDA. The plurality of data lines D1, D2, . . . , and Dm may be connected with the plurality of pixels PR, PG, and PB, respectively. The plurality of data lines D1, D2, . . . , and Dm may be connected with the data driver 20 to be described below, to transmit the data signal provided from the data driver 20 to the plurality of pixels PR, PG, and PB. The plurality of data lines D1, D2, . . . , and Dm may be connected with the plurality of thin film transistors T1 and T2, to transmit panel inspection signals received from the outside through the plurality of pads TPB, TPG, TPR, TGP1, and TGP2 to the plurality of pixels PR, PG, and PB. The plurality of data lines D1, D2, . . . , and Dm may be disposed at a predetermined pitch, and for example, a first pitch P1.

The plurality of thin film transistors may be connected with the plurality of data lines D1, D2, . . . , and Dm, respectively. The plurality of thin film transistors may be disposed within the non-display area NDA. The plurality of thin film transistors may be disposed between the display area DA and the data driver 20, but is not essentially limited thereto. The plurality of thin film transistors may control whether to transmit the panel inspection signal provided from the outside to the plurality of data lines D1, D2, . . . , and Dm. Each of the plurality of thin film transistors may include a gate electrode, a first electrode, and a second electrode. Each of the first electrode and the second electrode may be any one of a source electrode and a drain electrode. The thin film transistors T1 and T2 may determine whether to electrically connect the first electrode and the second electrode in response to a signal applied to the gate electrode. The first electrode may be connected with one of the plurality of data lines D1, D2, . . . , and Dm. The panel inspection signal provided from the outside of the display device 1 may be transmitted to the second electrode. The plurality of thin film transistors is turned on when inspecting defects in the display panel using the panel inspection signals. During a panel inspection period, the panel inspection signals are supplied to the plurality of data lines D1, D2, . . . , and Dm, and during a normal operation period, the plurality of thin film transistors may be turned off. When the plurality of thin film transistors T1 and T2 is turned off, even though a short circuit is generated or a noise is introduced to the line between the plurality of thin film transistors T1 and T2 and the plurality of pads TPB, TPG, TPR, TGP1, and TGP2, it is possible to prevent the plurality of data lines D1, D2, . . . , and Dm from being influenced from the short and the noise, thereby preventing deterioration of a display quality of the display device.

The plurality of thin film transistors T1 and T2 may be alternately disposed in the row direction of the matrix of the plurality of pixels PR, PG, and PB. That is, the plurality of thin film transistors T1 and T2 may be disposed so as to form a row relatively more adjacent to the display area DA and a row less adjacent to the display area DA, and the thin film transistors included in the row more adjacent to the display area DA and the thin film transistors included in the row less adjacent to the display area DA may be alternately disposed. The gate electrodes of the plurality of thin film transistors included in the row less adjacent to the display area DA may be connected through one line connected to a first thin film transistor control pad TGP1 to be described below. The gate electrodes of the plurality of thin film transistors included in the row more adjacent to the display area DA may be connected through one line connected to a second thin film transistor control pad TGP2 to be described below.

The plurality of thin film transistors T1 and T2 may include a plurality of first thin film transistors T1 and a plurality of second thin film transistors T2. The first thin film transistors T1 may be disposed to more adjacent to the display area DA than the second thin film transistors T2. The plurality of first thin film transistors T1 may form the row of the thin film transistors T1 and T2 adjacent to the display area, and the plurality of second thin film transistors T2 may form the row of the thin film transistors T1 and T2 relatively less adjacent to the display area DA. The first thin film transistors T1 and the second thin film transistors T2 may be alternately disposed.

The second electrodes of the thin film transistors T1 and T2 connected to the data lines connected to the pixels of the same color may be connected through one line. For example, the data lines of the thin film transistors T1 and T2 connected to the data lines D1, D4, . . . , and Dm-2 connected with the first pixel PR may be connected through one line to be connected with the first pad TPR, the data lines of the thin film transistors T1 and T2 connected to the data lines D2, D5, . . . , and Dm-1 connected with the second pixel PG may be connected through one line to be connected with the second pad TPG, and the data lines of the thin film transistors T1 and T2 connected to the data lines D3, D6, . . . , and Dm connected with the third pixel PB may be connected through one line to be connected with the third pad TPB. Accordingly, when the plurality of thin film transistors T1 and T2 is turned on, the same signal may be transmitted to the same type of pixel. That is, when the plurality of thin film transistors T1 and T2 is turned on, a signal applied to the first pad TPR may be transmitted to all of the first pixels PR, a signal applied to the second pad TPG may be transmitted to all of the second pixels PG, and the panel inspection signal applied to the third pad TPB may be transmitted to all of the third pixels PB.

The pads TPB, TPB, TPR, TPG1, and TPG2 may have wide lines, and shapes in which the lines are exposed to the outside of the display panel 10 in order to easily receive the signals from the outside of the display panel 10. The pads TPB, TPB, TPR, TPG1, and TPG2 may include the first pad TPR, the second pad TPG, the third pad TPB, and the first thin film transistor control pad TGP1, and the second thin film transistor control pad TGP2. The first pad TPR may be electrically connected with the second electrodes of the thin film transistors T1 and T2 connected to the data lines D1, D4, . . . , and Dm-2 connected to the first pixels PR. The second pad TPG may be electrically connected with the second electrodes of the thin film transistors T1 and T2 connected to the data lines D2, D5, . . . , and Dm-1 connected to the second pixels PG. The third pad TPB may be electrically connected with the second electrodes of the thin film transistors T1 and T2 connected to the data lines D3, D6, . . . , and Dm connected to the third pixels PB. The first thin film transistor control pad TGP1 may be connected to the gate electrodes of the plurality of first transistors T1. Whether to turn on/off the plurality of first thin film transistor T1 may be controlled by the signal applied to the first thin film transistor control pad TGP1. The second thin film transistor control pad TGP2 may be connected to the gate electrodes of the plurality of second transistors T2. Whether to turn on/off the plurality of second thin film transistor T2 may be controlled by the signal applied to the second thin film transistor control pad TGP2. Although not illustrated, the pads TPB, TPB, TPR, TPG1, and TPG2 may also further include pads connected to the plurality of scan lines S1, S2, . . . , and Sn.

The display panel 10 is manufactured and then is combined with another element, and then whether the display panel 10 has defect is checked. In a case where it is determined that the display panel 10 has defect, the display panel 10 and the other element need to be discarded together, or an operation of separating the other element from the display panel 10 needs to be performed in order to recycle the other element, so that efficiency of a manufacturing process of the display device 1 may deteriorate. Accordingly, in order to improve efficiency of the manufacturing process, it is necessary to check whether the display panel 10 has defect after the display panel 10 is manufactured and before the display panel 10 is combined with the other element, for example, the data driver 20, a timing controller 30, and the scan driver 40 to be described below. The display panel 10 may inspect whether the display panel 10 has defect by driving the display panel 10 by applying the signal to the pads TPR, TPG, TPB, TGP1, and TGP2 even before the display panel 10 is combined with the data driver 20, the timing controller 30, and the scan driver 40. Accordingly, the display device 1 according to the embodiment of the present invention may early detect defect of the display panel 10, thereby improving efficiency of the manufacturing process.

The display panel 10 may further include the plurality of scan lines S1, S2, . . . , and Sn. The plurality of scan lines S1, S2, . . . , and Sn may be disposed over the display area DA and the non-display area NDA. The plurality of scan lines S1, S2, . . . , and Sn may have shapes extended in the row direction of the matrix formed by the plurality of pixels PR, PG, and PB. The plurality of scan lines S1, S2, . . . , and Sn is insulated from the plurality of data lines D1, D2, . . . , and Dm to cross the plurality of data lines D1, D2, . . . , and Dm. The plurality of scan lines S1, S2, . . . , and Sn may be connected with the scan driver 40, and may transmit the scan signal output from the scan driver 40 to the plurality of pixels PR, PG, and PB.

The display device 1 may further include the timing controller 30, the data driver 20, and the scan driver 40. The timing controller 30, the data driver 20, and the scan driver 40 may be mounted on the non-display area NDA of the display panel 10, but are not essentially limited thereto, and may also be connected with the display panel through a flexible circuit board.

The timing controller 30 may receive image data R, G, and B, and may generate a data driver control signal DCS and a scan driver control signal SCS corresponding to the received signal.

The data driver 20 may receive the data driver control signal DCS, generate a data signal corresponding to the received data driver control signal DCS, and apply the generated data signal to the plurality of data lines D1, D2, . . . , and Dm. The data signal may include information about gray scales of images displayed at the plurality of pixels PR, PG, and PB.

The scan driver 40 may receive the scan driver control signal SCS, generate a scan signal corresponding to the received scan driver control signal SCS, and apply the generated scan signal to the plurality of scan lines S1, S2, . . . , and Sn. The scan signal may include information about a timing at which each of the plurality of pixels PR, PG, and PB receives the data signal.

Figure 2:
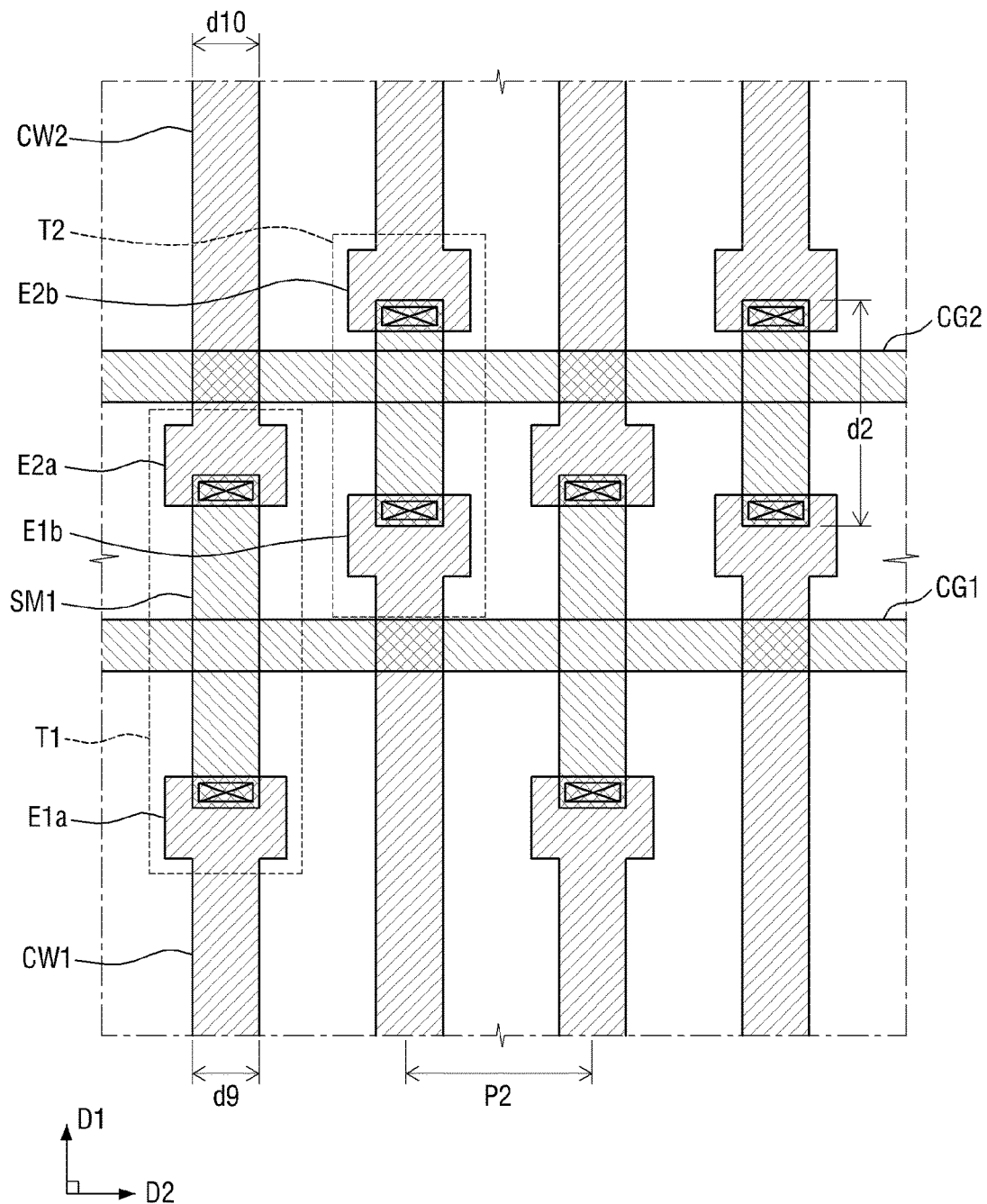
FIG. 2 is an enlarged top plan view illustrating lines in region II of FIG. 1.
Figure 3:
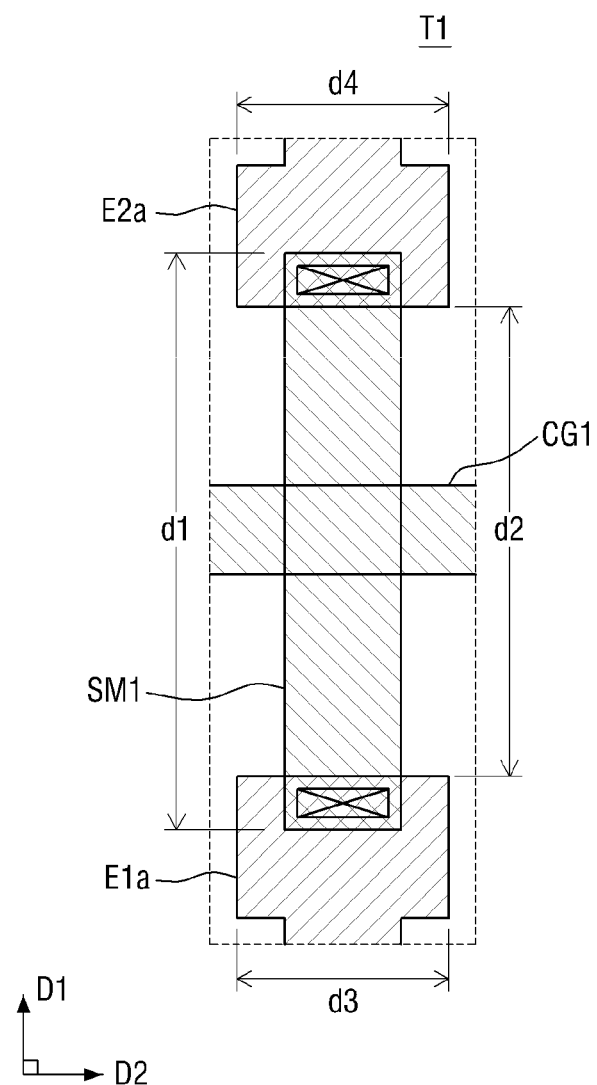
FIG. 3 is an enlarged top plan view illustrating a first thin film transistor according to the embodiment of the present invention.
Figure 4:
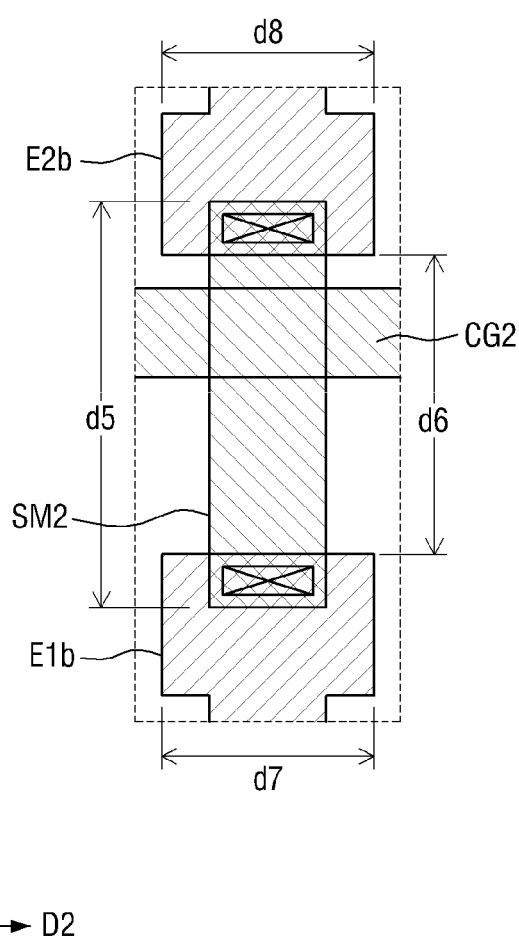
FIG. 4 is an enlarged top plan view illustrating a second thin film transistor according to the embodiment of the present invention.
Figure 5:
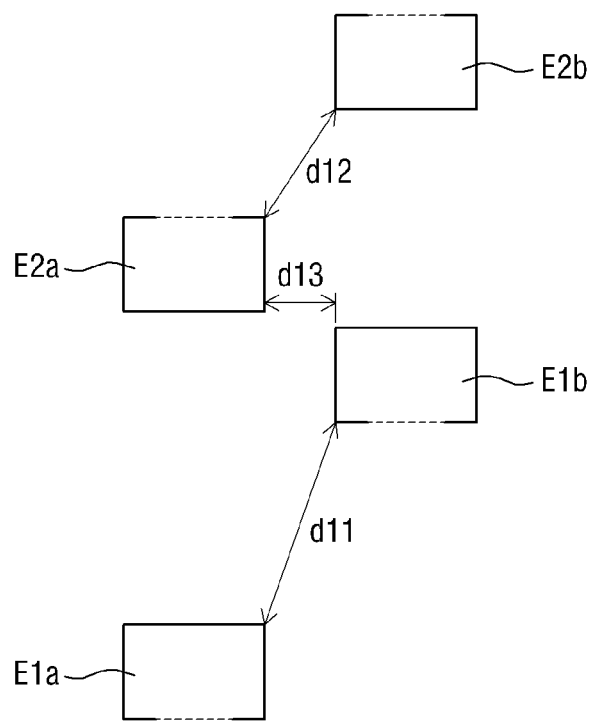
FIG. 5 is a diagram illustrating a position relation of first electrodes and second electrodes included in each of the first thin film transistor and the second thin film transistor according to the embodiment of the present invention.

Hereinafter, the plurality of thin film transistors T1 and T2 will be described in more detail with reference to FIGS. 2 to 5. FIG. 2 is an enlarged top plan view illustrating the lines in region II of FIG. 1. FIG. 3 is an enlarged top plan view illustrating the first thin film transistor according to the embodiment of the present invention. FIG. 4 is an enlarged top plan view illustrating the second thin film transistor according to the embodiment of the present invention. FIG. 5 is a diagram illustrating a position relation of the first electrode and the second electrode included in each of the first thin film transistor and the second thin film transistor according to the embodiment of the present invention.

Referring to FIG. 2, the display panel 10 may include a plurality of first connection lines CW1, a plurality of second connection lines CW2, a plurality of first electrodes E1a and E1b, a plurality of second electrodes E2a and E2b, a plurality of first semiconductor layer SM1, a plurality of second semiconductor layer SM2, and a first common gate line CG1, and a second common gate line CG2. The first electrode E1a, the second electrode E2a, the first semiconductor layer SM1, and the first common gate line CG1 may form the first thin film transistor T1. The first electrode E1b, the second electrode E2b, the second semiconductor layer SM2, and the second common gate line CG2 may form the second thin film transistor T2.

The plurality of first connection lines CW1 may be continuously disposed in the second direction D2. The plurality of first connection lines CW1 may have shapes extended in the first direction D1 vertical to the second direction D2. The plurality of first connection lines CW1 may be disposed at a second pitch P2. A width of the display area DA in the second direction may be larger than a width of the data driver 20 in the second direction, and thus the pitch of the data lines D1, D2, . . . , and Dm may be decreased in the area adjacent to the data driver 20 compared to the display area DA. Accordingly, in a case where the first and second thin film transistors T1 and T2 are disposed to be adjacent to the data driver 20, the second pitch P2 may be smaller than the first pitch P1. Each of the plurality of first connection lines CW1 may have a shape extended in the second direction D2. The plurality of first connection lines CW1 may be connected with the plurality of data lines D1, D2, . . . , and Dm, respectively.

The plurality of second connection lines CW2 may be continuously disposed in the second direction D2. The plurality of second connection lines CW2 may have shapes extended in the first direction D1. The plurality of second connection lines CW2 may be disposed at substantially the same pitch as that of the first connection lines CW1. Each of the second connection lines CW2 may be disposed to be spaced apart from the plurality of first connection lines CW1. Each of the second connection lines CW2 may be connected with any one among the first to third pads TPB, TPG, and TPB.

The plurality of first electrodes E1a and E1b may be connected with one ends of the plurality of first connection lines CW1, respectively. The plurality of first electrodes E1a and E1b may be integrally formed with the plurality of first connection lines CW1. A width d3 of each of the plurality of first electrodes E1a and E1b in the second direction D2 may be larger than a width d9 of each of the plurality of first connection lines CW1 in the second direction D2. The first electrodes E1a and E1b may have shapes in which the first connection line CW1 is extended in the second direction D2, but are not essentially limited thereto. Each of the plurality of first electrodes E1a and E1b may be included in the first thin film transistor T1 or the second thin film transistor T2. The first electrodes E1a included in the first thin film transistors T1 and the first electrodes E1b included in the second thin film transistors T2 may be alternately disposed in the second direction D2. The plurality of first electrodes E1a included in the first thin film transistors T1 and the plurality of first electrodes E1b included in the second thin film transistors T2 may be alternately disposed. The plurality of first electrodes E1a included in the first thin film transistors T1 may be disposed to form a column in the second direction D2, and the plurality of first electrodes E1b included in the second thin film transistors T2 may be disposed in the second direction D2 to form a different column from that of the plurality of first electrodes E1a included in the first thin film transistors T1. The column formed by the plurality of first electrodes E1a included in the first thin film transistors T1 may be more adjacent to the display area DA than the column formed by the plurality of first electrodes E1b included in the second thin film transistors T2. The first electrode E1a included in the first thin film transistor T1 may overlap and be in contact with the first semiconductor layer SM1. The first electrode E1b included in the second thin film transistor T2 may overlap and be in contact with the second semiconductor layer SM2.

Each of the plurality of second electrodes E2a and E2b may be disposed to be spaced apart from the plurality of first electrodes E1a and E1b in the first direction D1. The plurality of second electrodes E2a and E2b may be connected with one ends of the plurality of second connection lines CW2, respectively. The plurality of second electrodes E2a and E2b may be integrally formed with the plurality of second connection lines CW2. A width d4 of each of the plurality of second electrodes E2a and E2b in the second direction D2 may be larger than a width d10 of each of the plurality of second connection lines CW2 in the second direction D2. The second electrodes E2a and E2b may have shapes in which the second connection line CW2 is extended in the second direction D2, but are not essentially limited thereto. Each of the second electrodes E2a and E2b may be included in the first thin film transistor T1 or the second thin film transistor T2. The second electrode E2a included in the first thin film transistor T1 and the second electrode E2b included in the second thin film transistor T2 may be alternately disposed in the second direction D2. The plurality of second electrodes E2a included in the first thin film transistors T1 and the plurality of second electrodes E2b included in the second thin film transistors T2 may be alternately disposed. The plurality of second electrodes E2a included in the first thin film transistors T1 may be disposed to form a column in the second direction D2, and the plurality of second electrodes E2b included in the second thin film transistors T2 may be disposed in the second direction D2 to form a different column from that of the plurality of first electrodes E1a included in the first thin film transistors T1. The column formed by the plurality of second electrodes E2a included in the first thin film transistors T1 may be more adjacent to the display area DA than the column formed by the plurality of second electrodes E2b included in the second thin film transistors T2. The second electrode E2a included in the first thin film transistor T1 may overlap and be in contact with the first semiconductor layer SM1. The second electrode E2b included in the second thin film transistor T2 may overlap and be in contact with the second semiconductor layer SM2.

Each of the plurality of first semiconductor layers SM1 may be included in the first thin film transistor T1. Each of the plurality of first semiconductor layers SM1 may overlap and be in contact with the first electrode E1a and the second electrode E2a included in the first thin film transistor T1. The first semiconductor layer SM1 may be disposed under the first electrode E1a and the second electrode E2a included in the first thin film transistor T1, but is not essentially limited thereto, and may also be disposed on the first electrode E1a and the second electrode E2a. A length D1 of the first semiconductor layer SM1 in the first direction may be larger than a distance between the first electrode E1a and the second electrode E2a included in the first thin film transistor T1.

Each of the second semiconductor layer SM2 may be included in the second thin film transistor T2. Each of the plurality of second semiconductor layers SM2 may overlap and be in contact with the first electrode E1b and the second electrode E2b included in the second thin film transistor T2. The second semiconductor layer SM2 may be disposed under the first electrode E1b and the second electrode E2b included in the second thin film transistor T2, but is not essentially limited thereto, and may also be disposed on the first electrode E1b and the second electrode E2b. A length D1 of the second semiconductor layer SM2 in the first direction may be larger than a distance between the first electrode E1b and the second electrode E2b included in the second thin film transistor T2.

The first semiconductor layers SM1 and the second semiconductor layers SM2 may be alternately disposed. When the first semiconductor layers SM1 and the second semiconductor layers SM2 are alternately disposed, the plurality of first electrodes E1a and E1b included in the first thin film transistors T1 and the second thin film transistors T2 may be alternately disposed, and the plurality of second electrodes E2a and E2b may be alternately disposed, so that the large distance between the plurality of first electrodes E1a and E1b and the large distance between the plurality of second electrodes E2a and E2b may be maintained compared to a case where the plurality of first electrodes E1a and E1b and the plurality of second electrodes E2a and E2b are not alternately disposed, thereby decreasing a possibility in a generation of the short of the line. The first semiconductor layer SM1 may be disposed to be more adjacent to the display area DA compared to the second semiconductor layer SM2.

Lengths of the first semiconductor layer SM1 and the second semiconductor layer SM2 in the first direction D1 may be different from each other. For example, a length d1 of the first semiconductor layer SM1 in the first direction D1 may be larger than a length d5 of the second semiconductor layer SM2 in the first direction D1. When the length d1 of the first semiconductor layer SM1 in the first direction D1 is larger than the length d5 of the second semiconductor layer SM2 in the first direction D1, a distance d2 between the first electrode E1a and the second electrode E2a included in the first thin film transistor T1 may be larger than a distance d6 between the first electrode E1b and the second electrode E2b included in the second thin film transistor T2. Referring to FIG. 5, when the first semiconductor layers SM1 and the second semiconductor layers SM2 are alternately disposed, and the length d1 of the first semiconductor layer SM1 in the first direction D1 is larger than the length d5 of the second semiconductor layer SM2 in the first direction D1, a distance d11 between the first electrode E1a included in the first thin film transistor T1 and the first electrode E1b included in the second thin film transistor T2 may be larger than a distance d12 between the second electrode E2a included in the first thin film transistor T1 and the second electrode E2b included in the second thin film transistor T2. Accordingly, even though the first and second thin film transistors T1 and T2 are turned off, it is possible to decrease a possibility in a generation of a short of the first electrode E1a included in the first thin film transistor T1 and the first electrode E1b included in the second thin film transistor T2, which may generate the short to the plurality of data lines D1, D2, . . . , and Dm to generate defect.

The first common gate line CG1 may have a shape extended in the second direction D2. The first common gate line CG1 may be disposed to be insulated from and overlap the first semiconductor layer SM1. The first common gate line CG1 may be disposed on or under the first semiconductor layer SM1. The first common gate line CG1 may be connected to the first thin film transistor control pad TGP1. The first common gate line CG1 may serve as a common gate electrode of the plurality of first thin film transistors T1.

The second common gate line CG2 may have a shape extended in the second direction D2. The second common gate line CG2 may be disposed to be insulated from and overlap the second semiconductor layer SM2. The second common gate line CG2 may be disposed on or under the second semiconductor layer SM2. The second common gate line CG2 may be connected to the second thin film transistor control pad TGP2. The second common gate line CG2 may serve as a common gate electrode of the plurality of second thin film transistors T2.

The plurality of thin film transistors T1 and T2 may be disposed at the same first pitch P1 as that of the first connection line CW1 in the second direction D2.

Figure 6:
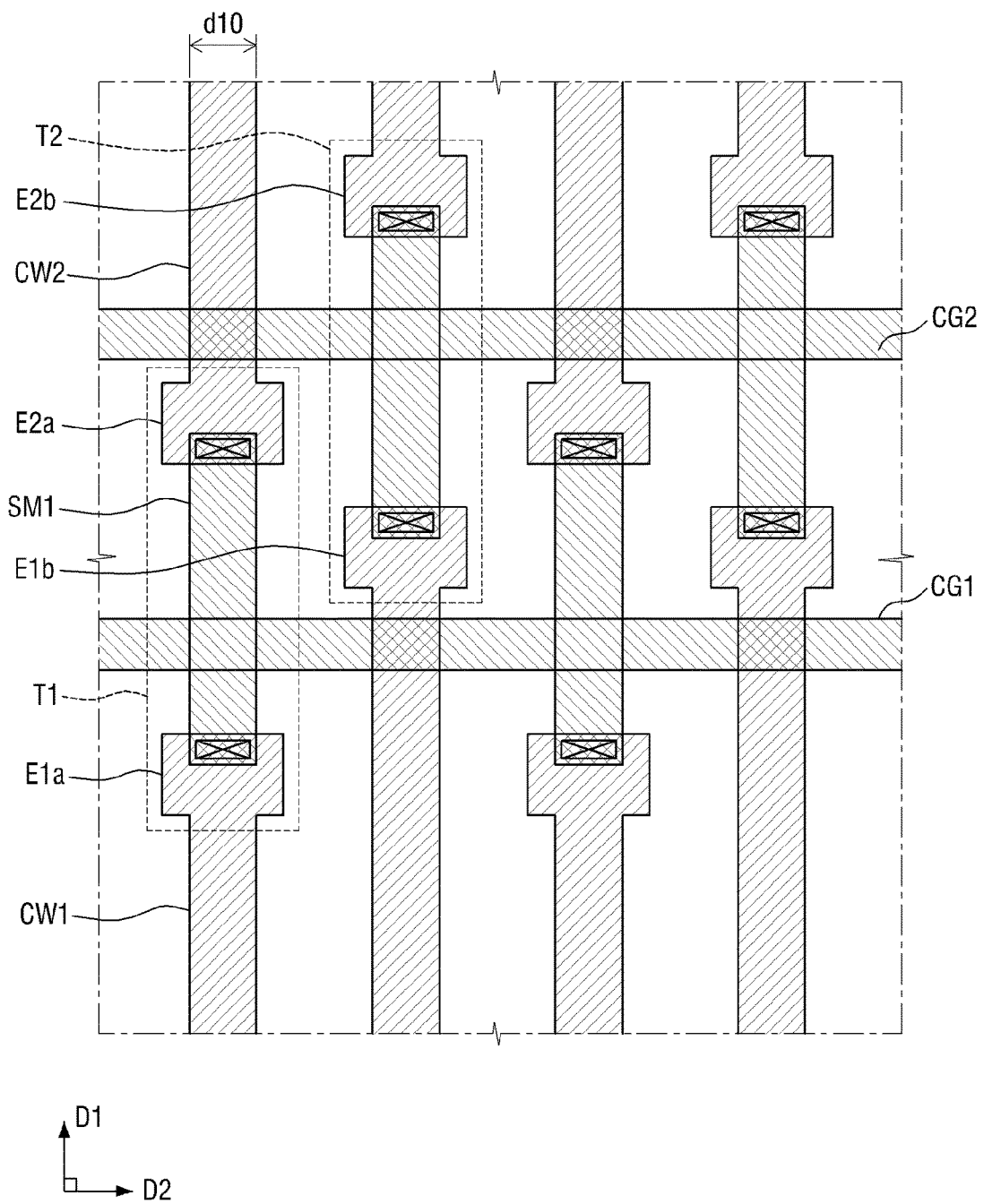
FIG. 6 is an enlarged top plan view illustrating lines in region II of FIG. 1 according to another embodiment of the present invention.
Figure 7:
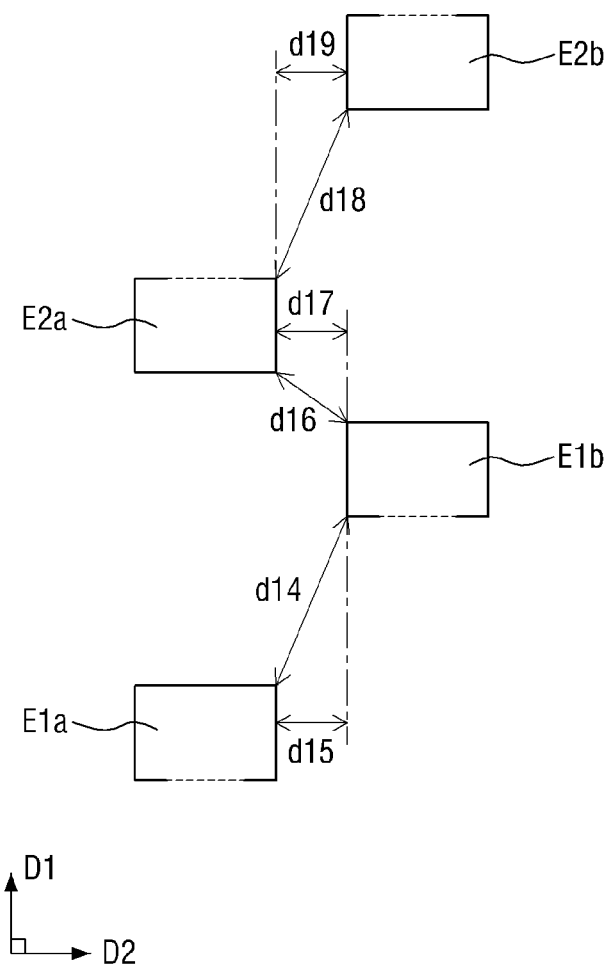
FIG. 7 is a diagram illustrating a position relation of a first electrode and a second electrode included in each of a first thin film transistor and a second thin film transistor according to another embodiment of the present invention.

Hereinafter, another embodiment of the present invention will be described with reference to FIGS. 6 and 7. FIG. 6 is an enlarged top plan view illustrating the lines in region II of FIG. 1 according to another embodiment of the present invention. FIG. 7 is a diagram illustrating a position relation of a first electrode and a second electrode included in each of a first thin film transistor and a second thin film transistor according to another embodiment of the present invention. The block diagram of a display device according to another embodiment of the present invention may be substantially the same as that of FIG. 1.

Referring to FIGS. 6 and 7, second semiconductor layers SM2 may be disposed in a second direction D2 of second electrodes E2a of first thin film transistors T1, and first semiconductor layers SM1 may be disposed in the second direction D2 of first electrodes E1b of the second thin film transistors T2. In this case, the first electrode E1a of the first thin film transistor T1 is disposed not to overlap the first electrode E1b of the second thin film transistor T2 in the second direction D2, thereby decreasing a possibility in a generation of a short between the first electrodes E1a and E1b. Further, the second electrode E2a of the first thin film transistor T1 is disposed not to overlap the second electrode E2b of the second thin film transistor T2 in the second direction D2, thereby decreasing a possibility in a generation of a short between the second electrodes E2a and E2b.

A distance d14 between the first electrode E1a of the first thin film transistor T1 and the first electrode E1b of the second thin film transistor T2 may be larger than a distance d15 in the second direction D2. Accordingly, the distance between the first electrode E1a of the first thin film transistor T1 and the first electrode E1b of the second thin film transistor T2 is larger than the distance between the first electrode E1a of the first thin film transistor T1 and the first electrode E1b of the second thin film transistor T2, which overlap each other in the second direction D2, thereby decreasing a possibility in a generation of a short between the first electrodes E1a and E1b.

A distance d18 between the second electrode E2a of the first thin film transistor T1 and the second electrode E2b of the second thin film transistor T2 may be larger than a distance d19 in the second direction D2. Accordingly, the distance between the second electrode E2a of the first thin film transistor T1 and the second electrode E2b of the second thin film transistor T2 is larger than the distance between the second electrode E2a of the first thin film transistor T1 and the second electrode E2b of the second thin film transistor T2, which overlap each other in the second direction D2, thereby decreasing a possibility in a generation of a short between the second electrodes E2a and E2b.

A distance d16 between the second electrode E2a of the first thin film transistor T1 and the first electrode E1b of the second thin film transistor T2 may be larger than a distance d17 in the second direction D2. In this case, the second electrode E2a of the first thin film transistor T1 is disposed not to overlap the first electrode E1b of the second thin film transistor T2 in the second direction D2, thereby decreasing a possibility in a generation of a short between the second electrode E2a of the first thin film transistor T1 and the first electrode E1b of the second thin film transistor T2.

Other descriptions of the elements of the display device according to another embodiment of the present invention are substantially the same as the descriptions for the embodiment of FIGS. 1 to 5, so that the descriptions will be omitted.

The foregoing is illustrative of the present invention and is not to be construed as limiting thereof. Although a few embodiments of the present invention have been described, those skilled in the art will readily appreciate that many modifications are possible in the embodiments without materially departing from the novel teachings and advantages of the present invention. Accordingly, all such modifications are intended to be included within the scope of the present invention as defined in the claims. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The present invention is defined by the following claims, with equivalents of the claims to be included therein.

What is claimed is:

1. A display device, comprising:
a display panel,
wherein the display panel comprises:
a plurality of pixels;
a plurality of data lines configured to transmit data signals to the plurality of pixels;
a plurality of thin film transistors including first electrodes electrically connected with the plurality of data lines, respectively, second electrodes disposed to be spaced apart from the first electrodes in a first direction, semiconductor layers overlapping the first electrodes and the second electrodes, and gate electrodes overlapping the semiconductor layers, respectively; and
pads electrically connected with the second electrodes, and
the plurality of thin film transistors includes a plurality of first thin film transistors and a plurality of second thin film transistors, which are alternately disposed,
the semiconductor layers of the plurality of second thin film transistors are adjacently disposed to the second electrodes of the first thin film transistors along a second direction vertical to the first direction, and
the semiconductor layers of the plurality of first thin film transistors are adjacently disposed to the first electrodes of the second thin film transistors along the second direction.

2. The display device of claim 1, wherein the display panel further comprises:
first connection lines extended from the first electrodes in an opposite direction to the first direction and electrically connected with the data lines, and
second connection lines extended from the second electrodes in the first direction and electrically connected with the pads, and
a width of the first electrode in the second direction is larger than a width of the first connection line in the second direction, and
a width of the second electrode in the second direction is larger than a width of the second connection line in the second direction.

3. The display device of claim 1, wherein a shortest distance between the first electrode of the first thin film transistor and the first electrode of the second thin film transistor is larger than a distance between the first electrode of the first thin film transistor and the first electrode of the second thin film transistor in the second direction.

4. The display device of claim 1, wherein a shortest distance between the second electrode of the first thin film transistor and the first electrode of the second thin film transistor is larger than a distance between the first electrode of the first thin film transistor and the first electrode of the second thin film transistor in the second direction.

5. The display device of claim 1, wherein a shortest distance between the second electrode of the first thin film transistor and the first electrode of the second thin film transistor is larger than a distance between the first electrode of the first thin film transistor and the first electrode of the second thin film transistor in the second direction.

6. The display device of claim 1, wherein the display panel further comprises:
a first common gate line serving as the common gate electrode of the plurality of first thin film transistors; and
a second common gate line serving as the common gate electrode of the plurality of second thin film transistors.

7. The display device of claim 6, wherein the first common gate line is extended in the second direction to overlap the semiconductor layers of the plurality of first thin film transistors, and
the second common gate line is extended in the second direction to overlap the semiconductor layers of the plurality of second thin film transistors.

8. The display device of claim 1, wherein the plurality of pixels includes a plurality of first to third pixels displaying different colors, and
the pads include:
a first pad connected with the second electrodes of the thin film transistors connected with the plurality of data lines transmitting the data signals to the plurality of first pixels among the plurality of data lines;
a second pad electrically connected with the second electrodes of the plurality of thin film transistors connected with the plurality of data lines transmitting the data signals to the plurality of second pixels among the plurality of data lines; and
a third pad electrically connected with the second electrodes of the plurality of thin film transistors connected with the plurality of data lines transmitting the data signals to the plurality of third pixels among the plurality of data lines.

9. The display device of claim 1, further comprising:
a data driver configured to apply the data signals to the plurality of data lines.

10. The display device of claim 1, wherein pitches of the plurality of data lines are larger than pitches of the thin film transistors in the second direction vertical to the first direction.

* * * * *